(12) United States Patent
Gotoda

(10) Patent No.: US 6,643,309 B1
(45) Date of Patent: Nov. 4, 2003

(54) SEMICONDUCTOR LASER DEVICE

(75) Inventor: Mitsunobu Gotoda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 79 days.

(21) Appl. No.: 10/049,601

(22) PCT Filed: Jul. 5, 2000

(86) PCT No.: PCT/JP00/04457

§ 371 (c)(1),
(2), (4) Date: Feb. 14, 2002

(87) PCT Pub. No.: WO02/03516

PCT Pub. Date: Jan. 10, 2002

(51) Int. Cl.[7] .............................. H01S 5/12; H01S 5/125
(52) U.S. Cl. ............................................ 372/46; 372/96
(58) Field of Search ............................ 372/46, 50, 102

(56) References Cited

U.S. PATENT DOCUMENTS 5,325,392 A * 6/1994 Tohmori et al. ............... 372/96
5,748,660 A 5/1998 Delorme et al.

FOREIGN PATENT DOCUMENTS

| JP | 5-235481 | 9/1993 |
| JP | 6-112570 | 4/1994 |
| JP | 10-308556 | 11/1998 |

OTHER PUBLICATIONS

Gardiner et al., "Three–Section Sampled–Grating DBR Lasers: Modelling And Measurements", IEE Proceedings–Optoelectronics, vol. 143, No. 1, Feb. 1996, pp. 24–30.
Woodward et al., "A DBR Laser Tunable By Resistive Heating", IEEE Photonics Technology Letters, vol. 4, No. 12, Dec. 1992, pp. 1330–1332.
Jayaraman et al., "Theory, Design, And Performance Of Extended Tuning Range Semiconductor Lasers With Sampled Gratings", IEEE Journal of Quantum, Electronics, vol. 29, No. 6, Jun. 1993, pp. 1824–1834.

* cited by examiner

Primary Examiner—James Davie
(74) Attorney, Agent, or Firm—Leydig, Voit & Mayer, Ltd.

(57) ABSTRACT

A high performance single-wavelength semiconductor laser device having stable and high-speed operation includes an active region, a forward light reflection region located in front of the active region, a backward light reflection region located behind the active region, and a phase control region located in proximity to the active layer, all sandwiched between an upper cladding layer and a lower cladding layer. The forward light reflection region and the backward light reflection region include alternate diffraction grating portions and non-diffracting portions alternately. The laser oscillates at a wavelength which corresponds to the current flowing in the diffraction grating portion. A current blocking layer is located on the non-diffracting portion of at least one of the forward light reflection region and the backward light reflection region for blocking current from flowing into the non-diffracting portion.

8 Claims, 8 Drawing Sheets

SEMICONDUCTOR LASER DEVICE

TECHNICAL FIELD

The present invention relates to a variable wavelength semiconductor laser which is required mainly for wavelength multiplex optical fiber communication, particularly to a variable wavelength semiconductor laser of multiple-electrode DBR structure wherein distributed Bragg reflectors (DBR) made of a semiconductor are disposed before and after an active region and a phase control region, and a control electrode is provided in each region.

BACKGROUND ART

An example of a variable wavelength semiconductor laser having a multiple-electrode DBR structure, specifically a sampled grating DBR laser which uses a sampled grating for the diffraction grating portion, will be described below. FIG. 11 is a schematic sectional view of a device having the constitution of sampled grating DBR 20 laser of the prior art described by V. Jayaraman et al. in IEEE J. Quantum Electronics, vol. 29, No. 6, 1993, pp 1824–1834.

In FIG. 11, reference numeral 1 denotes a forward light reflection region (also referred as forward mirror), 2 denotes a backward light reflection region (also referred as backward mirror), 3 denotes an active region, 4 denotes a phase control region, 5 denotes an n-type electrode, 6 denotes an n-type InP lower cladding layer, 7 denotes a p-type InP upper cladding layer, 8 denotes a p-type InGaAsP contact layer, 9 and 10 denote pitch modulation periods of the forward mirror and the backward mirror, respectively, 11 denotes a laser beam emitted from the forward end face of a laser resonator, 12 denotes an InGaAsP optical waveguide layer, 13 denotes a diffraction grating portion, 14 denotes discontinuity in the diffraction grating, and 15 denotes a p-type electrode.

The forward light reflection region 1 and the backward light reflection region 2 have sampled grating DBR mirrors formed on the InGaAsP optical waveguide layers on the forward end face side and the backward end face side of the laser resonator, respectively. Combined length of one diffraction grating portion 13 and one non-diffracting portion 14 (portion without diffraction grating formed therein) is called the pitch modulation period. In FIG. 11, the pitch modulation period of the forward mirror is indicated by reference numeral 9 and the pitch modulation period of the backward mirror is indicated by reference numeral 10. Each of the forward mirror and the backward mirror has a plurality of pitch modulation periods, while the pitch modulation period of the forward mirror and the pitch modulation period of the backward mirror are set to different values in general.

An optical waveguide of a laser oscillator has an InGaAsP layer sandwiched by the lower cladding layer 6 and the upper cladding layer 7 which have a forbidden band gap greater than that of the InGaAsP layer, while the backward light reflection region 2, the active region 3, a phase control region 4, and the forward light reflection region 1 are formed on the InGaAsP layer.

The active region 3 is constituted from an n-type InGaAsP strained quantum well which has a forbidden band gap smaller, on average, than the forbidden band gap of the InGaAsP optical waveguide layer 12 that constitutes the forward light reflection region 1 and the backward light reflection region 2, and the phase control region 4 comprises an InGaAsP optical waveguide layer having the same composition as that of the forward light reflection region 1 and the backward light reflection region 2.

Now the operation of the sampled grating DBR (SSG-DBR) laser of the prior art shown in FIG. 11 will be described below.

As shown in FIG. 11, the p-type electrodes 15 are formed separately on the active region 3, the forward light reflection region 1, the backward light reflection region 2 and the phase control region 4. When a forward bias voltage is applied between the p-type electrodes 15 which are formed separately on the active region 3 and the n-type electrode 5, current flows into the active region 3 so that spontaneous emission of light ranging over a broad band of wavelengths takes place in the active region 3. The emitted light propagates through the optical waveguide formed in the optical resonator, and light of a particular wavelength is reflected on a forward sampled grating DBR mirror formed in the forward light reflection region 1 and a backward sampled grating DBR mirror formed in the backward light reflection region 2 repetitively and is amplified in the active region, thus achieving laser oscillation.

In the sampled grating DBR laser shown in FIG. 11, supplying a current to the forward light reflection region 1 or the backward light reflection region 2 and the phase control region 4 results in a wavelength to be selected so that, at the single wavelength selected according to the current supplied, laser oscillation occurs.

A process of controlling the oscillation wavelength of the laser shown in FIG. 11 will now be described in detail.

FIG. 13 shows a reflectivity spectrum 16 of the forward mirror 1 and a reflectivity spectrum 17 of the backward mirror 2 in case current is not supplied in the forward and backward light reflection regions 1, 2. FIG. 14 shows a reflectivity spectrum 18 of the backward mirror 2 in case current is supplied only to the backward light reflection region 2 and the reflectivity spectrum 17 of the forward mirror 1 without current supply in comparison.

In FIG. 13 and FIG. 14, wavelength is plotted along the abscissa and power reflectivity is plotted along the ordinate. $\lambda_1$ is a wavelength at which the peaks of reflectivity of the forward and backward mirrors coincide in case current is not supplied to the forward and backward light reflecting regions 1, 2, and $\lambda_2$ is a wavelength at which the peaks of reflectivity of the forward and backward mirrors coincide in case current is supplied only to the backward light reflecting region 2.

The reflection spectrum of the sampled grating DBR consists of a plurality of sharp peaks of reflectivity which are different in height, although all peaks of reflectivity are shown in the diagram to have equal height since it is the sole object to show the wavelengths in FIG. 13 and FIG. 14.

As described previously, FIG. 13 shows the reflectivity spectrum in the initial state when the forward mirror control current and the backward mirror control current are both zero. In this case, the reflectivity spectra of the forward and the backward mirrors coincide at wavelength $\lambda_1$. As a result, power loss of light becomes extremely smaller at the wavelength $\lambda_1$ compared to the other wavelengths, which means relatively high gain of light at the wavelength $\lambda_1$ and therefore the laser oscillates at the wavelength $\lambda_1$.

The oscillation wavelength of the laser can be changed by applying a forward bias voltage to one or both of the forward light reflection region 1 and the backward light reflection region 2 to supply current to the region, equivalently changing the refraction indices of the light reflection regions 1 and 2 by way of free carrier plasma effect.

As shown in FIG. 14, for example, in case current is supplied only to the backward light reflection region 2, the reflectivity spectrum 18 of the backward mirror shifts to a shorter wavelength due to a decrease in the refraction index of the backward mirror, and the wavelength at which the reflectivity spectra of the forward and backward mirrors coincide changes to $\lambda_2$. As a result, light of wavelength $\lambda_2$ propagates in the laser resonator and is amplified so that laser oscillation eventually occurs. The oscillation wavelength can be changed similarly in case current is supplied only to the forward light reflection region 1 and in case current is supplied to both the forward light reflection region 1 and the backward light reflection region 2. Thus oscillation wavelength of the laser can be changed freely by supplying current to the light reflection regions where the mirrors are formed and controlling the intensity of the current supplied thereby changing the refraction index.

FIG. 12 shows an enlarged portion of a cross section of the sampled grating DBR for showing the direction of current flow when current is supplied to the InGaAsP optical waveguide layer 12, which constitutes the double heterostructure, such as the forward light reflection region 1 and the backward light reflection region 2, namely when current is caused to flow by applying a forward bias voltage across the p-type electrode 15 of the forward light reflection region 1 or the p-type electrode 15 of the backward light reflection region 2 and the n-type electrode 5. In FIG. 12, reference numeral 19 denotes mirror modulation period $\Lambda 0$, 20 denotes length $\Lambda g$ of the diffraction grating portion and 21 denotes the current supplied. The diagram is simplified by omitting the p-type electrode 15, the n-type electrode 5 and the p-InGaAsP contact layer 8. Direction of current supplied is indicated by the arrows.

When the forward bias is applied, positive holes are injected from the p-type electrode 15 through the p-InP upper cladding layer 7 and electrons are injected from the n-type electrode 5 through the n-InP lower cladding layer 6 into the InGaAsP optical waveguide layer 12. At this time, the supplied current 21 flows into the InGaAsP optical waveguide layer 12 uniformly over the entire region thereof, so as to equivalently decrease the refraction indices of the optical waveguides by way of the free carrier plasma effect. The decrease in the refraction index caused by the current supply causes a blue shift of the reflectivity spectrum 17 of the backward mirror as a whole, i.e., toward shorter wavelengths, so that the wavelength at which the peaks of reflectivity of the forward and backward mirrors coincide changes, thus making it possible to change the oscillation wavelength. Thus laser oscillation wavelength can be freely selected and controlled by equivalently changing the refraction index of the forward light reflection region 1 or the backward light reflection region 2 which constitutes the DBR mirror, in accordance with the current supply. The phase control region 4 is provided for the purpose of making fine adjustment of the phase of laser emission by applying the forward bias and supplying current to the region 4, thereby to stabilize the laser oscillation.

In a semiconductor laser device of the prior art such as that described above, laser oscillation wavelength can be freely selected and controlled by supplying a proper level of current to the forward light reflection region 1 or the backward light reflection region 2 so as to change the wavelength, and controlling the level of current supplied thereby equivalently changing the refraction index of the forward or backward light reflection region.

However, this results in such a state that the electrons and the positive holes injected into the forward light reflection region 1 or the backward light reflection region 2 coexist in the same semiconductor, namely in the same space. Such a state leads to recombination of the electrons and the positive holes, which causes spontaneous emission of light that occurs randomly due to the recombination. As a result, density of carriers in the forward or backward light reflection region varies, in the so-called carrier density fluctuation. The carrier density fluctuation in the light reflection region causes problems of deteriorating laser performance such as broadening of the line spectrum of laser light under wavelength control, and the problems become more conspicuous as the current supplied into the light reflection region increases.

The laser of the prior art also has such a problem that, since a certain amount of current is supplied to the. light reflection region, heat is generated accordingly. The heat generated by the current supply increases the refraction index of the light reflection region equivalently. The change in the refraction index due to the heat generation has a time constant that is fairly larger than that of the change in the refraction index caused by the free carrier plasma effect, and therefore it takes a longer time to control the laser oscillation wavelength and stabilize the oscillation. There is also such a problem that, when current supply to the light reflection region is continued, the oscillation wavelength changes over time due to deterioration of the device.

Thus in the semiconductor laser device of the prior art, recombination of the carriers occurs in the light reflection region when controlling the wavelength, and the recombination of the carriers causes broadening of the line spectrum of laser oscillation and an effective decrease in the optical output of the laser, thus resulting in such problems as channel interference when used in wavelength multiplex communication or coherent communication. The shift in wavelength due to the heat generated by current supply causes a drift in the laser oscillation wavelength particularly in case a large current is supplied to achieve a large change in the wavelength, thus resulting in the undesirably long time being taken to control the wavelength and other significant problems in the high speed operation, stability and other performance required for a light source used in optical communication

DISCLOSURE OF INVENTION

The present invention has been made to solve the problems of the semiconductor laser device of the prior art described above. The present invention provides a high performance single-wavelength semiconductor laser device which is capable of stable and high-speed operation with sufficiently small width of oscillation spectrum line and less shift or drift of the oscillation wavelength caused by the heat generation, by forming a current blocking layer in a portion of the light reflection region which controls the wavelength where diffraction grating is not formed, in contact with the light reflection region, thereby to suppress the injection of carriers into the light reflection region and the recombination of electrons and positive holes.

Specifically, the semiconductor laser device of the present invention includes an active region, a forward light reflection region located in front of the active region, a backward light reflection region located behind the active region and a phase control region located in proximity to the active layer, which are provided between the upper cladding layer and the lower cladding layer, wherein the forward light reflection region and the backward light reflection region are constituted by disposing diffraction grating portions and non-diffracting portions alternately, while the laser oscillates at a wavelength which corresponds to the current flowing in the diffraction grating portion, the semiconductor laser device being characterized in that a current blocking layer is formed on the non-diffracting portion of at least one of the forward light reflection region and the backward light reflection region, for the purpose of blocking the current from flowing into the non-diffracting portion.

In the semiconductor laser device of the present invention having such a constitution as described above, since the current blocking layer is provided in the light reflection region which controls the wavelength so as to prevent the current from flowing into the non-diffracting portion other than the diffraction grating portion where the diffraction grating is formed, thus electrons and positive holes are separated from each other in space in the optical reflection region other than the diffraction grating portion so that recombination of carriers do not occur when controlling the laser oscillation wavelength. This makes it possible to greatly reduce the occurrence of spontaneous emission of light and the variation in the density of carriers which accompany the carrier recombination, compared to the prior art, thus achieving laser oscillation having a narrow oscillation spectrum line. Also because the heat generated by the current supplied can be reduced, shift in the oscillation wavelength due to the heat can also be reduced, thus greatly improving the basic characteristics of the laser. Since the diffraction grating portion is typically designed to have smaller width than the non-diffracting portion, the laser characteristics can be greatly improved by the present invention. Even more remarkable effect can be achieved by designing the semiconductor laser device to have narrower diffraction grating portion.

Thus the present invention can provide a high performance single-wavelength semiconductor laser device which allows the oscillation wavelength of laser to be freely controlled and is capable of stable and high-speed operation with high reliability.

Therefore, use of the semiconductor laser device of the present invention in the wavelength multiplex communication or the coherent communication makes it possible to suppress channel interference and wavelength drift which have been posing problems in the wavelength multiplex communication or the coherent communication, and mitigate the problem of decreasing optical output of the laser.

In the semiconductor laser device of the present invention, it is preferable to form the current blocking layer in the non-diffracting portions of both the forward light reflection region and the backward light reflection region.

In the semiconductor laser device of the present invention, the current blocking layer can be comprised of a high-resistance layer which has a resistance higher than that of the non-diffracting portion.

Further in the semiconductor laser device of the present invention, in case the upper cladding layer has a first conductivity type and the lower cladding layer has a second conductivity type, the current blocking layer can also be constituted from a first semiconductor layer of the first conductivity type formed on the non-diffracting portion and a second semiconductor layer of the second conductivity type formed on the first semiconductor layer.

Also in the semiconductor laser device of the present invention, such a constitution may also be employed as the upper cladding layer is made of p-type InP, the lower cladding layer is made of n-type InP, the first semiconductor layer is made of p-type InP and the second semiconductor layer is made of n-type InP.

Also in the semiconductor laser device of the present invention, the current blocking layer may also be made of a semi-insulating semiconductor.

Furthermore, such a constitution may also be employed as the upper cladding layer is made of p-type InP, the lower cladding layer is made of n-type InP and the current blocking layer is made of semi-insulating InP.

Moreover in the semiconductor laser device of the present invention, such a constitution may also be employed that a heater is provided so as to change the temperature of one of the forward light reflection region and the backward light reflection region, and the current blocking layer is formed in the non-diffracting portion of the other light reflection region so as to -block the current from flowing in the non-diffracting portion, in which case the wavelength can be changed more effectively.

BEST MODE FOR CARRYING OUT THE INVENTION

Now the present invention will be described below by way of preferred embodiments with reference to the accompanying drawings.

Embodiment 1

Figure 1:
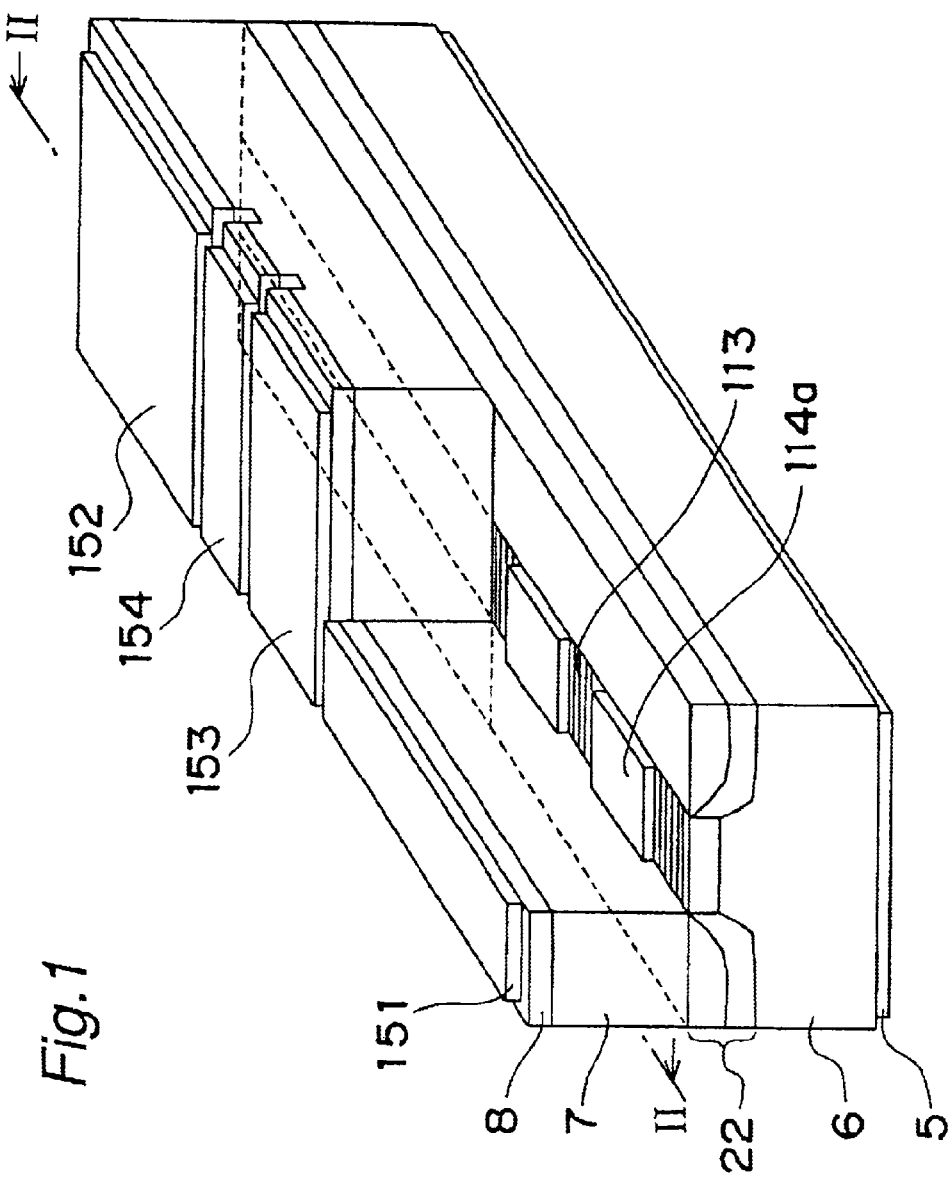
FIG. 1 is a perspective view of a semiconductor laser device according to the first embodiment of the present invention.
Figure 2:
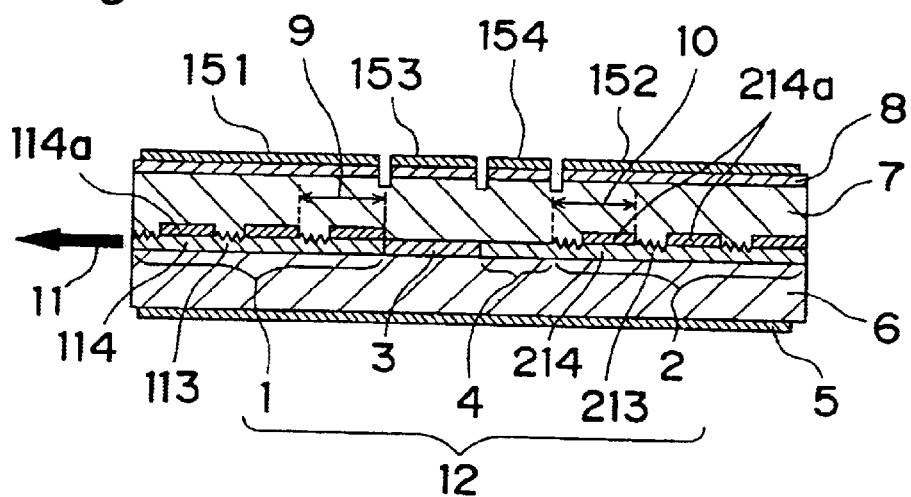
FIG. 2 is a sectional view taken along line II—II in FIG. 1.

FIG. 1 is a perspective view of the semiconductor laser device according to the first embodiment of the present invention. FIG. 2 is a sectional view taken along line II—II in FIG. 1. The device is shown partially cut away in the perspective view of FIG. 1 to help understanding.

The semiconductor laser device according to the first embodiment is a semiconductor laser device which has an InGaAsP optical waveguide layer 12 formed between an upper cladding layer 7 made of p-type InP and a lower cladding layer 6 made of n-type InP as shown in FIG. 2, and is a wavelength adjustable multiple-electrode DBR laser device which is capable of changing the wavelength by a method described below.

The InGaAsP optical waveguide layer 12 comprises an n-type InGaAsP strain quantum well active region 3, a forward light reflection region 1 located in front of the active region 3, a backward light reflection region 2 located behind the active region 3 and a phase control region 4 provided between the active region 3 and the backward light reflection region 2, while p-type electrodes are formed separately so as to apply different bias voltages to the different regions.

With this constitution, as described in conjunction with the prior art, the laser oscillation wavelength is made adjustable by changing the wavelength of the light reflected in the forward light reflection region 1 and the backward light reflection region 2 in accordance to the applied voltage.

In the semiconductor laser device of the first embodiment, in particular, the problems of the prior art are solved by forming current blocking layers 114a, 214a on non-diffracting portions 114, 214 of the forward light reflection region 1 and the backward light reflection region 2.

Specifically, the semiconductor laser device of the first embodiment has such a constitution as the forward light reflection region (forward mirror) 1 which controls the wavelength comprises the diffraction grating portion 113 where diffraction grating (sampled grating) is formed and the non-diffracting portion 114 where diffraction grating is not formed are formed alternately in the optical waveguide layer 12 on the light emitting end of the semiconductor laser device.

The backward light reflection region (backward mirror) 2 which also controls the wavelength comprises the diffraction grating portion 213 where diffraction grating (sampled grating) is formed and the non-diffracting portion 214 where diffraction grating is not formed are formed alternately in the optical waveguide layer 12 on the end opposing the light emitting end.

The active region 3 is located between the forward light reflection region 1 and the backward light reflection region 2 in the optical waveguide layer 12, and is constituted from n-type InGaAsP strain quantum well.

The phase control region 4 is made of a semiconductor of the same composition as that of the forward and backward light reflection regions 1, 2, and is located between the active region 3 and the backward light reflection region 2, so as to control the phase of the laser light.

Composition of InGaAsP of the forward and backward light reflection regions 1, 2 is selected so that the forbidden band gap thereof is larger than the mean forbidden band gap of the active region 3, so as to function as a sampled grating DBR mirror for the light which is emitted in the active region 3 without absorbing the light emitted in the active region 3.

In the semiconductor laser device of the first embodiment, in order to supply current efficiently into the forward light reflection region 1, the backward light reflection region 2, the active region 3 and the phase control region 4, the optical waveguide layer 12 and the n-InP lower cladding layer 6 are partially etched into stripe shape, then a current confinement layers 22 having high resistance are grown on both sides of the stripe, followed by the formation thereon of the p-InP upper cladding layer 7 and the p-InGaAsP contact layer 8, as shown in FIG. 1.

For the purpose of individually controlling the currents which are supplied to the forward light reflection region 1, the backward light reflection region 2, the active region 3 and the phase control region 4, the contact layer 8 is etched to such a depth that reaches the p-type InP upper cladding layer 7 thereby electrically isolating it, and p-type electrodes 151, 152, 153, 154 are formed on the separated contact layers 8. This makes it possible to individually supply currents to the different regions.

In the first embodiment, the n-InP lower cladding layer 6 is constituted from an n-InP substrate which has the n-type electrode 5 formed on the bottom surface thereof, and the regions which constitute the optical waveguide layer 12 are formed consecutively on the substrate, thereby forming the laser resonator (optical resonator) between one end and the other end of the substrate.

Further according to the first embodiment, the current blocking layer 114a is formed on the non-diffracting portion 114 in which diffraction grating is not formed among the portions in the forward light reflection region (forward mirror) 1 so as to block current from flowing into the non-diffracting portion 114, and the current blocking layer 214a is formed on the non-diffracting portion 214 in which diffraction grating is not formed among the portions in the backward light reflection region (backward mirror) 2 so as to block current from flowing into the non-diffracting portion 214.

The current blocking layers 114a, 214a are made of a high-resistance material of which resistance is higher than at least that of the optical waveguide layer.

While the current blocking layers 114a, 214a are formed between the InGaAsP optical waveguide layer 12 and the p-type InP upper cladding layer 7 in the first embodiment, the present invention is not limited to this constitution and the current blocking layers may also be formed between the optical waveguide layer 12 and the n-InP lower cladding layer 6.

The active layer 3 is formed integrally with the same thickness as the optical waveguide layer 12 in the first embodiment, although the invention is not limited to this constitution and the active region may also be formed on the InGaAsP optical waveguide layer 12 or in the vicinity thereof as in the prior art.

Now the operation of the semiconductor laser device according to the first embodiment of the present invention will be described below. The active region 3, the forward light reflection region 1, the backward light reflection region 2 and the phase control region 4 combine to constitute the optical resonator for the laser oscillation. When a forward bias voltage is applied between the p-type electrode 153 which is formed over the active region 3 and the n-type electrode 5 as shown in FIG. 1, current flows into the active region so as to cause spontaneous emission of light. The light generated in the active region 3 propagates through the optical waveguide 12 that constitutes the laser resonator, and is repetitively reflected in the forward light reflection region 1 and in the backward light reflection region 2 which include the diffraction grating portions provided at the end faces of the resonator, so that the light is amplified to have increased light intensity and one particular wavelength is selected and laser oscillation is achieved at a certain threshold, thus emitting laser light 11.

Figure 3:
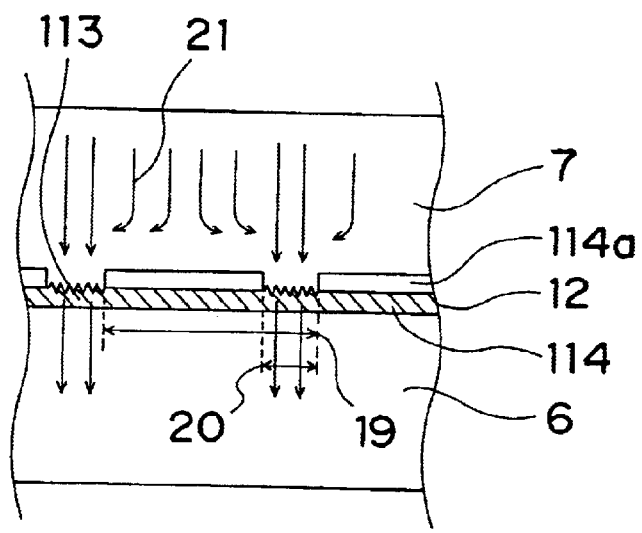
FIG. 3 is a schematic sectional view showing the current flow in a forward light reflection region in the first embodiment.

Now the process of controlling the wavelength in the semiconductor laser device according to the first embodiment will be described below. FIG. 3 shows a portion of a cross section of the mirror portion when current is supplied to the InGaAsP optical waveguide layer 12 which constitutes the double hetero-structure comprising the forward light reflection region 1 located between the upper cladding layer and the lower cladding layer, namely when the current is caused to flow by applying a forward bias voltage across the p-type electrode 151 of the forward light reflection region 1 and the n-type electrode 5. In FIG. 3, reference numeral 19 denotes mirror modulation period $\Lambda 0$, 20 denotes length $\Lambda g$ of the diffraction grating portion and 21 denotes the current supplied. FIG. 3 is simplified by omitting the p-type electrode, the n-type electrode 5 and the p-InGaAsP contact layer 8. Direction of current supplied is indicated by the arrows.

Figure 13:
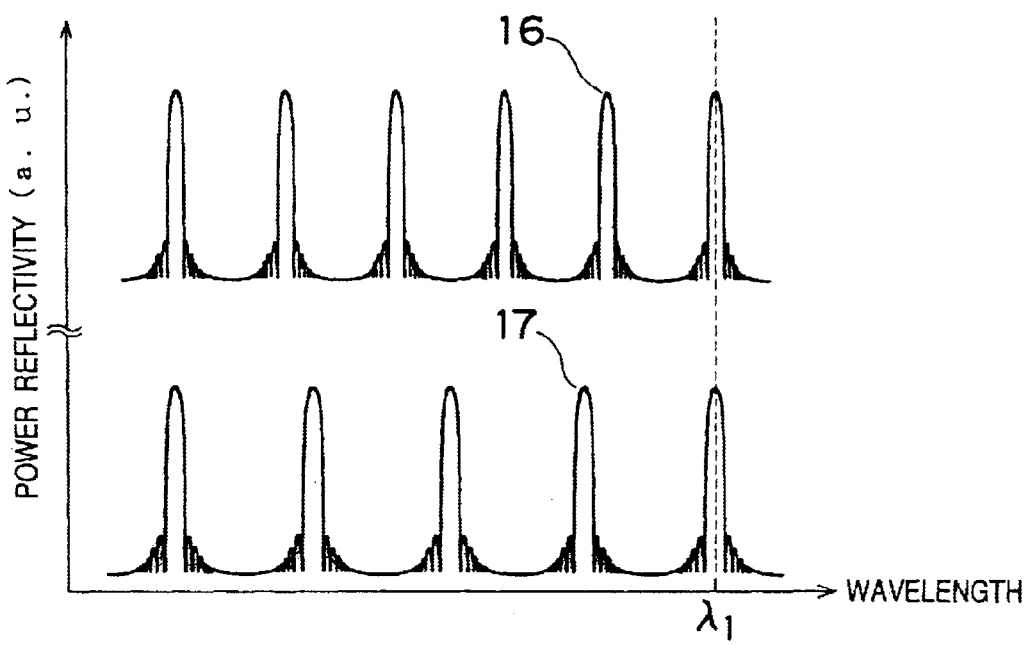
FIG. 13 is a graph showing the power reflectivity against wavelengths in the initial state of the forward and backward light reflection regions of the prior art.
Figure 14:
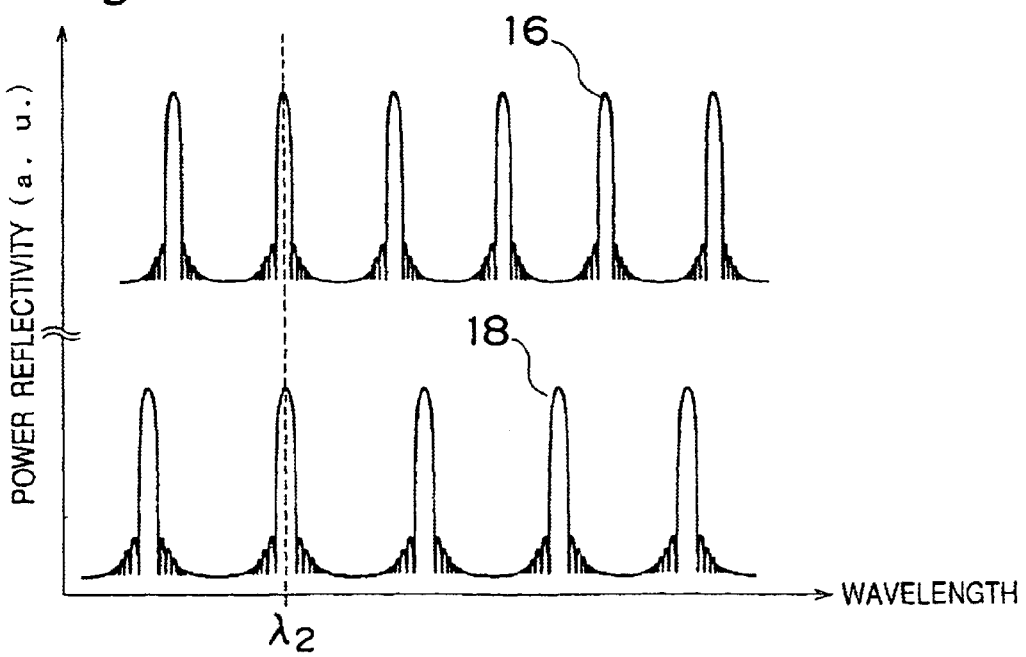
FIG. 14 is a graph showing the power reflectivity against wavelengths when current is supplied to the forward and backward light reflection regions of the prior art.

Reflection spectra of the forward light reflection region (forward mirror) 1 and the backward light reflection region (backward mirror) 2 in the present invention are the same as those of the semiconductor laser of the prior art shown in FIGS. 13, 14 which will therefore be used in the description that follows. When current is not supplied to the mirror region, the reflection spectrum of the mirror has a plurality of sharp minor peaks around the center wavelength given by equation (1) as shown in FIG. 13.

$$\lambda_B = 2 \cdot n_{\it eff} \cdot \Lambda_B / m \quad (1)$$

Space between peaks $\lambda_s$ is given by equation (2) showing that peaks of reflection of the forward and backward mirrors coincide at the wavelength $\lambda_1$.

$$\lambda_s = 2 \cdot n_{\it eff} \cdot \Lambda_B^2 / \Lambda_0 \quad (2)$$

where $\lambda_B$ is the diffraction grating pitch of the diffraction grating portion 113, $n_{\it eff}$ is the effective refraction index of the optical waveguide 12 and m is the number of order of the diffraction grating (typically m=1).

When current is supplied to the backward mirror, for example, in order to change the oscillation wavelength, electrons are injected from the lower cladding layer 6 into the InGaAsP optical waveguide layer 12 which has narrower forbidden band gap than the lower cladding layer. 6 and positive holes are injected from the upper cladding layer 7 into the InGaAsP optical waveguide layer 12 which has narrower forbidden band gap than the upper cladding layer 7, so that current flows continuously in the region of width $\Lambda_g$ 20 where the diffraction grating exists, similarly to the prior art, when consideration is given to the mirror modulation period $\Lambda_0$ 19. In the region of width $(\Lambda_0 - \Lambda_g)$ of the non-diffracting portion 114, on the other hand, of which resistance is higher than the diffraction grating portion 113 where the diffraction grating is formed, since there is the current blocking layer 114a that has high resistance formed on the optical waveguide layer 12. Therefore, the current 21 which has been supplied flows mostly into the diffraction grating portion 113 as shown with the arrows, not through the current blocking layer 114a which has high resistance. As a result, current supplied from the p-type electrode 151 flows mostly into the diffraction grating portion 113 due to the current blocking effect of the current confinement layer 22 and the current blocking layer 114a shown in FIG. 1.

Similarly in the backward light reflection region 2, current supplied from the p-type electrode 152 is concentrated by the current blocking effect of the current blocking layer 214a so as to flow into the diffraction grating portion 213.

When current is supplied to the forward mirror 1 or the backward mirror 2, wavelength of reflected light can be changed by the free carrier plasma effect caused by the existence of the electrons and the positive holes, although contribution to the change of the reflection peak of the forward and backward mirrors is basically made only by the diffraction grating portions 113, 213 while the non-diffracting portions 114, 214 do not contribute to the change of the reflection wavelength, as will be seen from equations (1) and (2).

That is, the free carrier plasma effect caused by the existence of the electrons and positive holes injected by the current supply works only to the diffraction grating portion 113 or 213 of the forward mirror 1 or the backward mirror 2.

Thus the entire reflection spectrum can be shifted toward shorter wavelength similarly to the prior art by supplying current only to the diffraction grating portions 113, 213 so that the refraction indices of the diffraction grating portions 113, 213 are decreased.

When current is supplied only to the diffraction grating portion 213 of the backward mirror 2, for example, the wavelength at which the peaks of reflectivity of the forward and backward mirrors coincide shifts to $\lambda_2$ on the shorter wavelength side, and the gain at the wavelength $\lambda_2$ becomes relatively higher, so that the laser oscillates at the wavelength $\lambda_2$, as shown in FIG. 14. Thus in the semiconductor laser device of the first embodiment constituted from the forward mirror 1 comprising the current blocking layer 114a formed in the non-diffracting portion 114 and the backward mirror 2 comprising current blocking layer 214a formed in the non-diffracting portion 214, oscillation wavelength of the semiconductor laser device can be freely controlled for laser operation by supplying current to the forward mirror 1 or the backward mirror 2 thereby to change the refraction index of the forward mirror 1 or the backward mirror 2 and applying the forward bias voltage to the phase control region 4 thereby to make fine adjustment of the phase of the laser light, similarly to the prior art.

The semiconductor laser device of the first embodiment has the following advantages over the prior art, since current supply can be concentrated to the diffraction grating portions 113, 213 which contribute to the change in the reflection peaks of the forward and backward mirrors since the current blocking layers 114a, 214a are formed.

(1) While electrons and positive holes recombine similarly to the prior art in the diffraction grating portions 113, 213 where current is supplied in the forward and backward mirrors, electrons and positive holes are not injected and therefore do not coexists in the same space in the non-diffracting portions 114, 214 located right below the current blocking layers 114a, 214a and therefore recombination of carriers do not occur.

Since this makes it possible to suppress the spontaneous emission of light due to the recombination of carriers and significantly reduce the variation in the density of carriers caused thereby, spreading of the spectrum line width of laser oscillation can be mitigated when controlling the oscillation wavelength of the laser. Fluctuation of the oscillation wavelength and instability of optical output can also be mitigated, thus providing the semiconductor laser device having high performance.

(2) Current required to achieve the same amount of shift in wavelength becomes about $\Lambda_g/\Lambda_0$ times that of the prior art. Since $\Lambda_g$ is generally determined to be sufficiently smaller than $\Lambda_0$ in order to increase the adjustable range of laser oscillation wavelengths, the semiconductor laser device of the first embodiment is capable of changing the wavelength efficiently with an extremely small current.

Accordingly, heat generated by supplying the current can also be decreased thus making it possible to improve the reliability by reducing the red shift (shift toward longer wavelength) of the oscillation wavelength due to heat generation and preventing the device from deteriorating.

Embodiment 2

Figure 4:
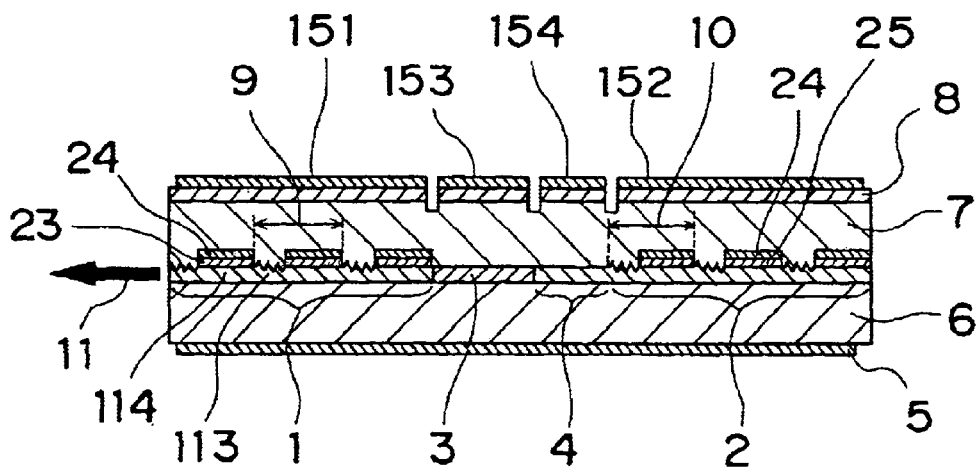
FIG. 4 is a sectional view of a semiconductor laser device according to the second embodiment of the present invention.

FIG. 4 is a sectional view of a semiconductor laser device according to the second embodiment of the present invention.

Figure 5:
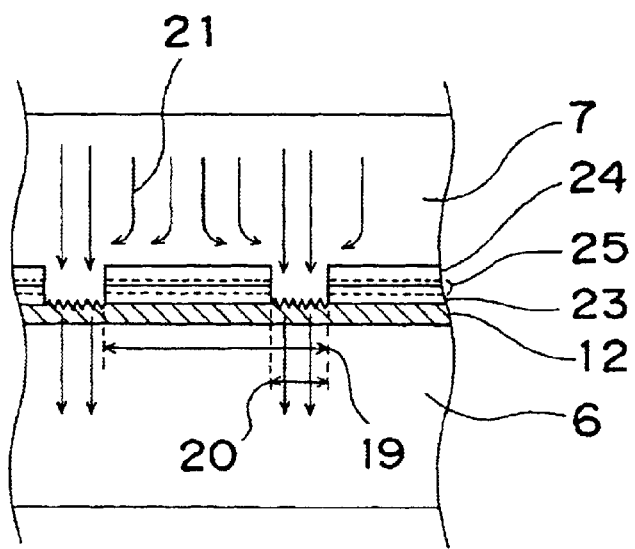
FIG. 5 is a schematic sectional view showing the current flow in a forward light reflection region in the second embodiment.

FIG. 5 is a drawing for explaining the current supply in the forward light reflection region 1 and the backward light reflection region 2. Reference numerals similar to those of FIGS. 1 through 3 are used in FIG. 4 and FIG. 5.

The semiconductor laser device of the second embodiment has a constitution similar to that of the semiconductor laser device of the first embodiment except for forming a current blocking layer comprising two layers of a p-type InP layer 23 formed on the non-diffracting portions 114, 214 and an n-type InP layer 24 formed on the p-type InP layer 23 instead of the current blocking layers 114a, 214a which has high resistance.

As the operation of laser oscillation in the semiconductor laser device of the second embodiment having the constitution described above is exactly the same as that of the semiconductor laser device of the first embodiment, description that follows will be focused on the operation of controlling the wavelength in the semiconductor laser device described above.

In the second embodiment, as shown in FIG. 5, when a forward bias voltage is applied between the lower cladding layer 6 and the upper cladding layer 7 in the forward light reflection region 1, electrons and positive holes are injected into the diffraction grating portion 113 and accumulate therein, so that the refractive index of the diffraction grating portion 113 is decreased by the free carrier plasma effect. In the non-diffracting portion 114, on the other hand, since the p-type InP layer 23 is formed on the non-diffracting portion 114 in contact therewith and n-type InP layer 24 is formed on the p-type InP layer 23, applying the forward bias voltage between the lower cladding layer 6 and the upper cladding layer 7 causes a reverse bias voltage to be applied between the p-type InP layer 23 and the n-type InP layer 24, so that a depletion layer 25 which has high resistance is generated near the interface of both layers by the evacuation of the carriers. Thus the p-type InP layer 23, the depletion layer 25 and the n-type InP layer 24 perform the function to block the current from flowing into the non-diffracting portion 114 (a function similar to that of the current blocking layer 114a in the first embodiment), thereby preventing the current from flowing into the non-diffracting portion 114. Since electrons and positive holes hardly exist in the non-diffracting portion 114, there occur no spontaneous emission of light from recombination of carriers and variation in the density of carriers. Thus makes it to obtain the semiconductor laser device which has narrow oscillation spectrum line and high-speed and stable operation performance, similarly to the semiconductor laser device of the first embodiment.

Embodiment 3

Figure 6:
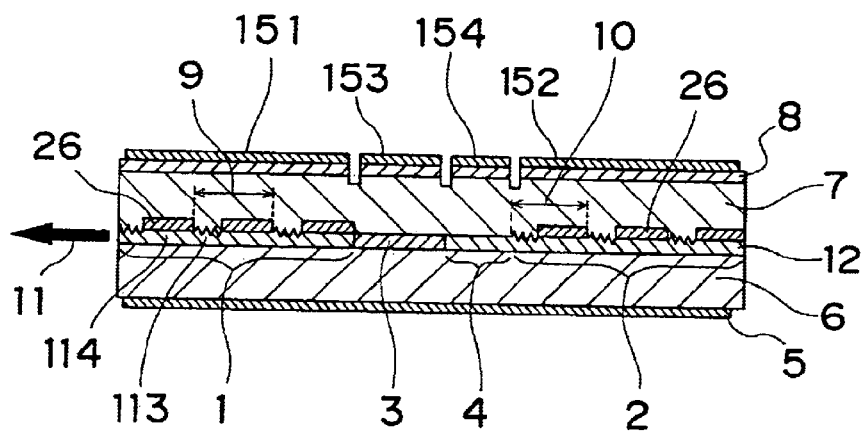
FIG. 6 is a sectional view of a semiconductor laser device according to the third embodiment of the present invention.

FIG. 6 is a sectional view of the semiconductor laser device according to the third embodiment of the invention. Components in FIG. 6 similar to those in FIG. 1 and FIG. 2 will be identified with the same reference numerals.

The semiconductor laser device of the third embodiment has a constitution similar to that of the semiconductor laser device of the first embodiment except for forming a current blocking layer 26 comprising a semi-insulating InP layer formed on the non-diffracting portions 114, 214, instead of the current blocking layers 114a, 214a which have high resistance.

In the semiconductor laser device of the third embodiment having the constitution described above, the current blocking layer 26 comprising the semi-insulating InP layer functions similarly to the current blocking layers 114a, 214a of the first embodiment, so that the semiconductor laser device of the third embodiment has operations and effects similar to those of the semiconductor laser device of the first embodiment The term "semi-insulating" used above means resistivity on the order of $10^5$ to $10^7$ $\Omega \cdot m$. The semi-insulating InP layer can be formed from InP doped with, for example, Ti or Fe.

Embodiment 4

Figure 7:
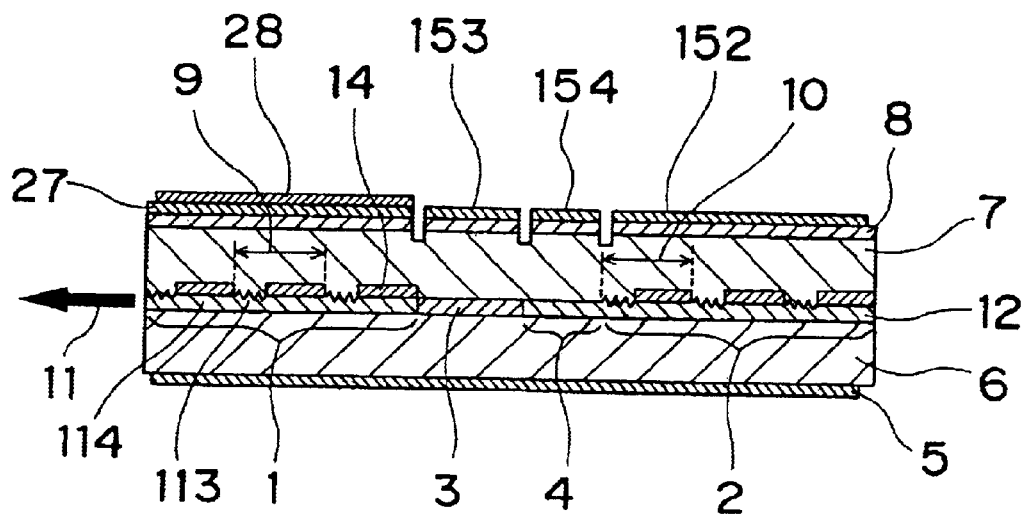
FIG. 7 is a sectional view of a semiconductor laser device according to the fourth embodiment of the present invention.
Figure 8:
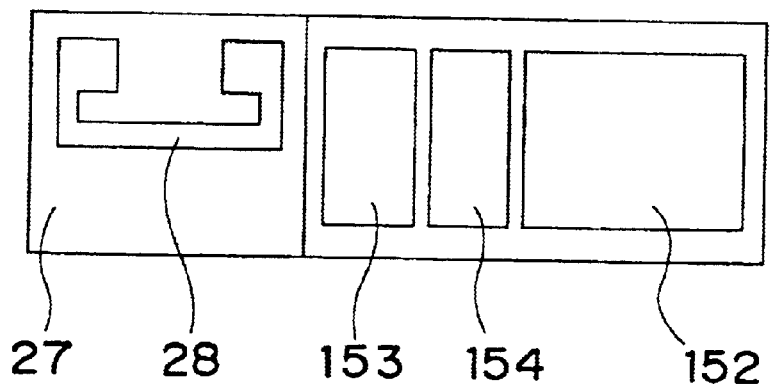
FIG. 8 is a plan view of the semiconductor laser device according to the fourth embodiment.

FIG. 7 is a sectional view of the semiconductor laser device according to the fourth embodiment of the invention. FIG. 8 is a sectional view of the semiconductor laser device according to the fourth embodiment.

Components in FIG. 7 and FIG. 8 similar to those in FIG. 1 through FIG. 3 will be identified with the same reference numerals.

The semiconductor laser device of the fourth embodiment has a constitution similar to that of the semiconductor laser device of the first embodiment except for providing a thin film heater 28 comprising a thin metal film of Pt or Au via an insulation film 27 made of $SiO_2$ or the like, instead of the p-electrode 151 which is provided in correspondence to the forward light reflection region 1 in the first embodiment.

In the semiconductor laser device according to the fourth embodiment, the current blocking layer 114a is provided on the non-diffracting portion 114 of the forward light reflection region 1 similarly to the first embodiment shown in FIG. 1 and FIG. 2, although the current blocking layer 114a provided on the forward light reflection region 1 is not essential and may be omitted in the fourth embodiment.

Now the operation of the semiconductor laser device of the fourth embodiment will be described below. In the semiconductor laser device according to the fourth embodiment, similarly to the first embodiment, the active region 3, the forward light reflection region 1, the backward light reflection region 2 and the phase control region 4 combine to constitute the optical resonator, while the forward light reflection region 1 and the backward light reflection region 2 function as sampled grating DBR mirror. When a forward bias voltage is applied between the p-type electrode 153 formed over the active region 3 and the n-type electrode 5 shown. in FIG. 7 and FIG. 8, current flows into the active region so as to cause spontaneous emission of light. The light generated in the active region 3 propagates through the optical waveguide that constitutes the laser resonator, and is repetitively reflected in the forward light reflection region 1 and in the backward light reflection region 2 provided at the end faces of the resonator while being amplified to have increased light intensity so that one particular wavelength is selected by a mechanism to be described below, and laser oscillation is eventually achieved at a certain threshold, thus emitting laser light 11.

Figure 9:
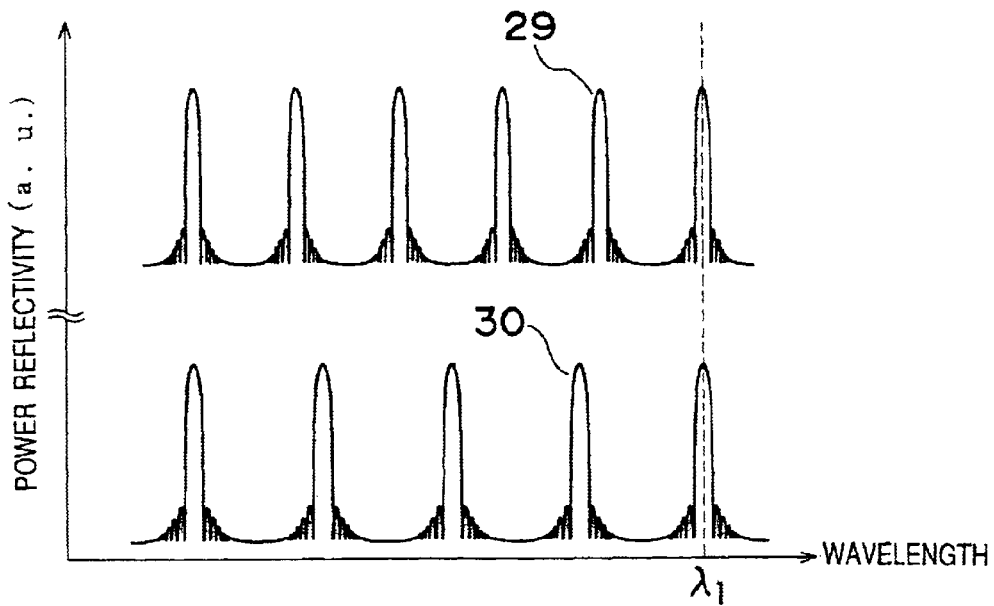
FIG. 9 is a graph showing the power reflectivity against wavelengths in the initial state of the forward and backward light reflection regions according to the fourth embodiment.
Figure 10:
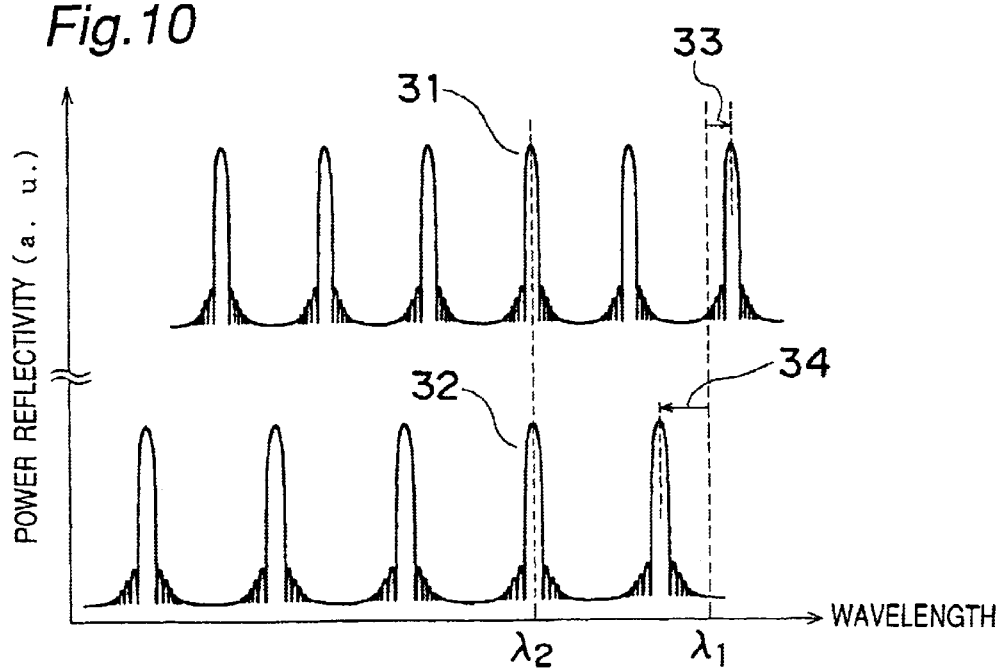
FIG. 10 is a graph showing the power reflectivity against wavelengths when current is supplied to the forward and backward light reflection regions according to the fourth embodiment.
Figure 11:
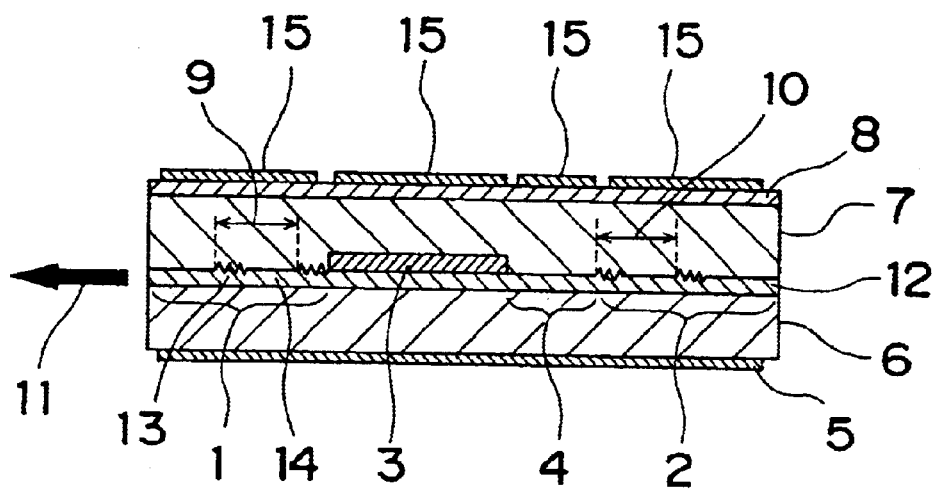
FIG. 11 is a sectional view of a semiconductor laser device of the prior art.
Figure 12:
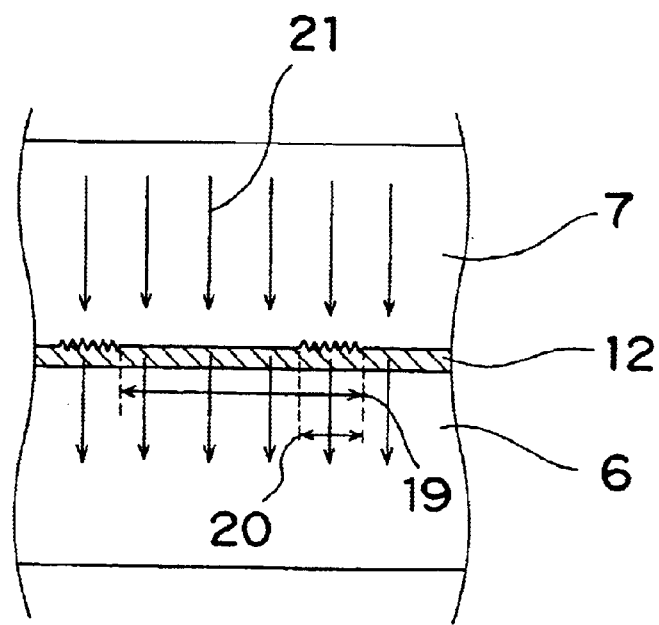
FIG. 12 is a schematic sectional view showing the current flow in a forward light reflection region and backward light reflection region of the prior art example.

Now the process of controlling the wavelength in the semiconductor laser device according to the fourth embodiment will be described below with reference to FIG. 9 and FIG. 10. FIG. 9 shows the reflectivity spectrum of the backward mirror in the initial state (when heater 28 is off and voltage is not applied to the backward mirror). In FIG. 9, reference numeral 29 denotes the reflectivity spectrum of the forward mirror and 30 denotes the reflectivity spectrum of the backward mirror. FIG. 10 shows the reflectivity spectra of the forward and backward mirrors when it is enabled to change the wavelength, in which reference numeral 31 denotes the reflectivity spectrum of the forward mirror, 32 denotes the reflectivity spectrum of the backward mirror, 33 denotes the amount of wavelength shift at the forward mirror, and 34 denotes the amount of wavelength shift at the backward mirror.

When it is assumed that the reflection peaks of the forward mirror 1 and the backward mirror 2 coincide at wavelength $\lambda_1$ as shown in FIG. 9, oscillation occurs also at the wavelength $\lambda_1$. In order to change the oscillation wavelength, it is necessary to shift the wavelengths of the reflection peaks of the forward mirror 1 and the backward mirror 2. Reflection peak wavelength of the semiconductor DBR mirror can be shifted to longer wavelength by up to about 10 nm by supplying current to the DBR portion and heat it thereby changing the refraction index, as reported by S. L. Woodward et al. in IEEE Photonics Technology Letters, vol. 4, No. 12, 1992, pp1330–1332.

In the semiconductor laser device of the fourth embodiment, when a current is supplied to the thin film heater 28 of the forward light reflection region 1 so as to heat the forward light reflection region 1, the reflectivity spectrum 31 of the forward mirror 1 is shifted to a longer wavelength as shown in FIG. 10. The magnitude and direction of the wavelength shift 33 are indicated by the arrow in FIG. 10. When a forward bias voltage is applied between the p-type electrode 152 and the n-type electrode 5 thereby to supply a current to the backward mirror 2, the reflectivity spectrum 32 of the backward mirror 2 shifts toward a shorter wavelength since the free carrier plasma effect decreases the refraction index of the diffraction grating portion 213, as described previously. The magnitude and direction of the wavelength shift 34 are also indicated by the arrow. Thus the wavelength at which the reflection peaks of the forward mirror 1 and the backward mirror 2 coincide changes to $\lambda_2$, and the oscillation wavelength also changes to $\lambda_2$.

As described above, when current is supplied to the thin film heater 28 for heating, the reflectivity spectrum of the forward mirror shifts to a longer wavelength, and when a forward bias voltage is applied between the p-type electrode 152 and the n-type electrode 5 to supply current to the backward mirror 2, the reflectivity spectrum of the backward mirror 32 is shifted toward a shorter wavelength by the free carrier plasma effect. Consequently, the semiconductor laser device of the fourth embodiment has such an advantage that the current required to make the reflection peaks of the forward mirror 1 and the backward mirror 2 coincide becomes far smaller than in the cases of the first through third embodiments, because of the combined effects of heating the forward light reflection region 1 and the energization of the backward light reflection region 2.

While the first, second, third and fourth embodiments described above all relate to the semiconductor laser device formed on the n-type InP semiconductor substrate, the present invention is not limited to this constitution and it is obvious that similar effects can be achieved also with semiconductor laser devices which is formed on a p-type InP substrate or has another composition such as GaAs/AlGaAs semiconductor, by modifying the constitution to an extent which does not deviate from the sprit and scope of the present invention. In the second and third embodiments of the present invention, the InP semiconductor layer is used to constitute the current blocking layer, although the effects similar to those of the second and third embodiments can also be achieved by using a material which has greater forbidden band gap than the optical waveguide layer such as InAlGaAs or InGaAsP. Moreover, the current blocking layer which has a two-layer or one-layer constitution in the embodiments described above may of course be constituted from three or more semiconductor layers including the layers of the above embodiments.

Industrial Applicability

According to the present invention, as described above, the semiconductor laser device having narrow oscillation spectrum line can be obtained. Further, since the heat generated by the current supply is reduced, shift of the oscillation wavelength can also be decreased thus greatly improving the basic characteristics of the laser light.

Consequently, according to the present invention, oscillation wavelength can be freely controlled while making remarkable improvements over such problems as channel interference and wavelength drift which have been causing troubles to the wavelength multiplex communication or the coherent communication, and achieving a decrease in the effective optical output of the laser, and therefore the single-wavelength semiconductor laser device which has high performance and high reliability and is capable of stable and high-speed operation can be provided.

What is claimed is:

1. A semiconductor laser device comprising:
    upper and lower cladding layers;
    an active region, a forward light reflection region located in front of the active region, a backward light reflection region located behind the active region, and a phase control region located in proximity to the active layer, all located between said upper and lower cladding layers, said forward light reflection region and said backward light reflection region including alternating diffraction grating portions and non-diffracting portions, the laser device oscillating at a wavelength corresponding to a current flowing in said diffraction grating portion; and
    a current blocking layer on the non-diffracting portion of at least one of said forward light reflection region and said backward light reflection region to block current from flowing into the non-diffracting portion.

2. The semiconductor laser device according to claim 1 including current blocking layers on said non-diffracting portions of both of said forward light reflection region and said backward light reflection region.

3. The semiconductor laser device according to claim 1 wherein said current blocking layer includes a high-resistance layer having a resistance higher than said non-diffracting portion.

4. The semiconductor laser device according to claim 1 wherein said upper cladding layer is of a first conductivity type and said lower cladding layer is of a second conductivity type, said current blocking layer includes a first semiconductor layer of the first conductivity type on said non-diffracting portion and a second semiconductor layer of the second conductivity type on said first semiconductor layer.

5. The semiconductor laser device according to claim 4 wherein said upper cladding layer is p-type InP, said lower cladding layer is n-type InP, said first semiconductor layer is p-type InP, and said second semiconductor layer is n-type InP.

6. The semiconductor laser device according to claim 1 wherein said current blocking layer is a semi-insulating semiconductor.

7. The semiconductor laser device according to claim 6 wherein said upper cladding layer is p-type InP, said lower cladding layer is n-type InP, and said current blocking layer is semi-insulating InP.

8. The semiconductor laser device according to claim 1 including a heater for changing temperature of one of said forward and backward light reflection regions, and said current blocking layer is located in said non-diffracting portion of the other of said forward and backward light reflection regions to block the current from flowing in said non-diffracting portion.

* * * * *